(12) United States Patent
Sayre et al.

(10) Patent No.: US 8,114,517 B2
(45) Date of Patent: Feb. 14, 2012

(54) MICRONETWORKS, MICROCHANNELS/CYLINDERS AND THE PROCESS FOR MAKING THE SAME

(75) Inventors: Jay R. Sayre, Columbus, OH (US); James L. White, Columbus, OH (US)

(73) Assignee: Battelle Memorial Institute, Columbus, OH (US)

( * ) Notice: Subject to any disclaimer, the term of this patent is extended or adjusted under 35 U.S.C. 154(b) by 736 days.

(21) Appl. No.: 11/195,496

(22) Filed: Aug. 1, 2005

(65) Prior Publication Data
US 2007/0003631 A1 Jan. 4, 2007

Related U.S. Application Data

(60) Provisional application No. 60/592,850, filed on Jul. 30, 2004.

(51) Int. Cl.
*B32B 21/02* (2006.01)
*C08K 9/10* (2006.01)
(52) U.S. Cl. .......... 428/402.21; 428/402.22; 428/320.2; 428/321.1; 428/321.5; 523/205
(58) Field of Classification Search .............. 428/320.2; 523/200
See application file for complete search history.

(56) References Cited

U.S. PATENT DOCUMENTS

| | | | |
|---|---|---|---|
| 6,808,461 B2 | 10/2004 | Harris et al. | |
| 6,858,659 B2 | 2/2005 | White et al. | |
| 2003/0013551 A1* | 1/2003 | Harris et al. | 473/367 |
| 2004/0195728 A1 | 10/2004 | Slomski et al. | |
| 2004/0265550 A1 | 12/2004 | Glatkowski et al. | |
| 2005/0038173 A1 | 2/2005 | Harris et al. | |
| 2005/0250878 A1* | 11/2005 | Moore et al. | 523/211 |

FOREIGN PATENT DOCUMENTS

| | | |
|---|---|---|
| WO | WO 2004/007608 A2 | 1/2004 |
| WO | WO 2004/052559 A2 | 6/2004 |
| WO | WO 2005/119772 A2 | 12/2005 |

OTHER PUBLICATIONS

Fluid definition from WIkipedia.*
SR White; NR Sottos; PH Geubelle; JS Moore; MR Kessler; SR Sriram; EN Brown; S Viswanathan; Autonomic Healing of Polymer Composites, Nature, Feb. 15, 2001, 794-797, v. 409.

* cited by examiner

*Primary Examiner* — Hai Vo
(74) *Attorney, Agent, or Firm* — Klaus Wiesmann; Yimei C. Hammond

(57) ABSTRACT

A micronetwork made from microcapsules with or without nanomaterials and/or micromaterials such as microtubes, nanotubes and/or buckyballs; the micronetworks can be formulated to provide for unique properties such as reduction of crack propagation and/or corrosion.

6 Claims, 6 Drawing Sheets

MICRONETWORKS, MICROCHANNELS/CYLINDERS AND THE PROCESS FOR MAKING THE SAME

This application claims the benefit of Provisional application Ser. No. 60/592,850, filed Jul. 30, 2004.

The entire disclosure of the above provisional application is incorporated herein by reference.

FIELD OF THE INVENTION

The invention provides for micronetworks, microchannels/cylinders and the process for making the same that are useful in making self-healing materials, smart materials, structural composites, microfluidic devices, timed-release medicines, printing materials, color changing materials, and materials useful in corrosion prevention and control.

BACKGROUND OF THE INVENTION

There is a need to provide enhanced protection from crack propagation in structural composites and corrosive effects in materials. Examples include autonomic healing of propagating cracks within the crack plane to retard or prevent large-scale damage in structural composites and corrosion prevention and control of surfaces in harsh marine environments. Likewise additional micronetworks and associated micromaterials are needed for structural composites, microfluidic devices, timed-release medicines, printing materials, color changing materials, and materials useful in corrosion prevention and control.

BRIEF DESCRIPTION OF THE INVENTION

Broadly the invention provides for a micronetwork made up of at least one liquid or solid containing microcapsule connected to at least one or more microcapsules by one or more microchannels/cylinders so as to provide a connection from at least one microcapsule to at least one other microcapsule via at least one or more microchannels/cylinders. A channel is anything that allows a fluid to flow. A cylinder can be either hollow (tube) or solid (rod). In a further embodiment of the invention the inventive materials can have nanomaterials, such as carbon nanotubes, incorporated in the microcapsules, micronetwork and/or the microchannels/cylinders to create a nanocomposite. Typically the nanotubes are single-walled carbon nanotubes or multi-walled carbon nanotubes. In some embodiments buckyballs or other nano/micro materials/particles can be incorporated in the microcapsules, micronetwork and/or microchannels/cylinders. Fluid material in the microcapsules typically flows between about $-1°$ C. to about $300°$ C. depending on the fluid and application. Preferably the material flows at about typical ambient temperatures such as at about room temperature and atmospheric pressure. Naturally occurring capillary and osmotic pressures can also aid in this process. Dicyclopentadiene in the liquid phase or solid phase is a preferred resin for the core material within the microcapsules.

Another embodiment of the invention provides for a method for making a micronetwork including the steps of providing a resin; producing microcapsules containing a solid, liquid or gas having an average size range from about 1 to about 1,000 micrometers with a shell made from organic polymers, gelatin, starches, waxes or fats; placing the microcapsules in a selected medium; releasing the encapsulated substance from a microcapsule by one of several mechanisms, such as mechanical rupture of the capsule shell, dissolution of the shell, melting of the shell, diffusion/permeation through the shell, slow erosion of the shell, biodegradation, osmotic release and photolytic release; and controlling the fluid flow from one or more microcapsules to form a micronetwork and/or microchannel/cylinder by the flow of liquid in the microcapsule(s) to one or more microcapsules by temperature control and time. In a further embodiment the invention can have nanomaterials, such as carbon nanotubes, incorporated in the microcapsules, micronetwork and/or the microchannels/cylinders to create a nanocomposite. Typically the nanotubes are single-walled carbon nanotubes or multi-walled carbon nanotubes. In some embodiments buckyballs or other nano/micro materials/particles can be incorporated in the microcapsules, micronetwork and/or microchannels/cylinders.

Another embodiment of the invention provides for a method for making a corrosion prevention/control coating by the steps of providing a precursor coating material; mixing a liquid or solid micronetwork and/or microchannel/cylinder with the precursor coating material. In another embodiment, other nano/micro materials/particles can be incorporated in the microcapsules, micronetwork and/or microchannels/cylinders to create a nanocomposite.

A yet further embodiment of the invention provides for protecting a surface from corrosion by coating the surface with a coating material containing a liquid or solid micronetwork and/or microchannel/cylinder. In another embodiment, other nano/micro materials/particles can be incorporated in the microcapsules, micronetwork and/or microchannels/cylinders to create a nanocomposite.

An additional embodiment of the invention provides for reducing crack propagation by mixing a liquid or solid micronetwork and/or microchannel/cylinder with a material in which crack propagation is to be reduced. In another embodiment, other nano/micro materials/particles can be incorporated in the microcapsules, micronetwork and/or microchannels/cylinders to create a nanocomposite.

A further embodiment of the invention includes a microchannel/cylinder separated from the microcapsules in the micronetwork described above. In another embodiment, other nano/micro materials/particles can be incorporated in the microcapsules, micronetwork and/or microchannels/cylinders to create a nanocomposite.

BRIEF DESCRIPTION OF THE DRAWINGS

FIG. 1D is FIG. 1C at larger magnification.

In FIG. 2 the liquid (water) has been removed and the dicyclopentadiene has been polymerized. The image is at about 200× magnification.

DETAILED DESCRIPTION OF THE INVENTION AND BEST MODE

Figure 1A:
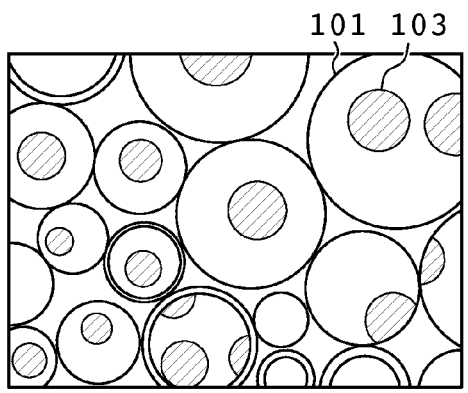
FIGS. 1A, 1B, 1C and 1D are drawings of images of microcapsules without particle additives showing an original set of the microcapsules and their subsequent fracture and micronetworking in the upper right, lower left, and lower right. These capsules are interconnected by microchannels/cylinders. The microcapsules were dispersed in water and the dicyclopentadiene is uncured. The drawing depicts an image of about 200× magnification. Fractures are evident in FIG. 1B and the dicyclopentadiene surrounds the fractured microcapsules with a microchannel/cylinder between them.

Microencapsulation is the process of enclosing a substance in a capsule so that the substance can be easily released. The encapsulant can be a solid, liquid or gas. Capsules can range in size from 1 micrometer to 1,000 micrometers and can be made from organic polymers, gelatin, starches, waxes or fats. There are several mechanisms by which the core material can be released from a microcapsule, such as mechanical rupture of the capsule shell, dissolution of the shell, melting of the shell, diffusion/permeation through the shell, slow erosion of the shell, biodegradation, osmotic release and photolytic release.

The present invention broadly provides for micronetworks, microcapsules, and microchannels/cylinders that in some embodiments contain particle additives. These particle additives can be nanomaterials, such as carbon nanotubes, incorporated in the microcapsules, micronetwork and/or the microchannels/cylinders to create a nanocomposite. Typically the nanotubes are single-walled carbon nanotubes or multi-walled carbon nanotubes. In some embodiments buckyballs or other nano/micro materials/particles can be incorporated in the microcapsules, micronetwork and/or microchannels/cylinders.

The micronetworks, microcapsules, and microchannels/cylinders serve to provide unique properties to materials. Some of the unique properties include self healing due to prevention of crack propagation, increased healing efficiencies, increased strength, increased fracture toughness and modulus, improved thermal management and electrical conductivity, smart properties, self assembling properties, high-aspect ratios, corrosion prevention and control, and the like.

One embodiment of the present invention provides for microcapsules that are processed to produce micronetworks, that are interconnected by microchannels/cylinders. One particular embodiment is the addition of nanoparticles that are then processed to produce micronetworks having the nanoparticles within the microcapsule shells, micronetwork and microchannels/cylinders. For example the microcapsules may be about 1 μm up to about 1,000 μm in diameter and the microchannels/cylinders may be about 1 μm to up to about 500 μm long with and without single walled carbon nanotubes. The longest microchannel/cylinder produced to present was about 300 μm long.

A broad embodiment of the invention provides for a micronetwork that includes a microcapsule connected to at least one or more microcapsules by one or more microchannel/cylinders wherein one or more microcapsules are fractured and an encapsulant within the microcapsule released to form the microchannel/cylinder. Typically a nanomaterial, micromaterial or a combination thereof is incorporated in the micronetwork. In some embodiments the nanomaterial, micromaterial, or a combination thereof is a crack or corrosion controller or inhibitor. In other embodiments the crack or corrosion inhibitor is enclosed within the microchannel. In yet other embodiments the nanomaterial or micromaterial is incorporated in a wall or shell of the microcapsule or microchannel/cylinder, or in the encapsulant. Typically, the release of encapsulant occurs at a temperature between about −1° C. to about 300° C.

In another broad embodiment the invention provides for a method for making a micronetwork by the steps of providing an encapsulating media and an encapsulant; producing microcapsules from the encapsulant media and encapsulant having an average size range from about 1 to about 1000 microns, wherein encapsulant is captured within the microcapsules; dispersing the microcapsules in a selected fluid; and fracturing the microcapsules to form a micronetwork. Another embodiment provides for controlling the flow of encapsulant from one or more microcapsules to form a micronetwork by the flow of encapsulant in the microcapsule (s) to at least contact one or more microcapsules by control of pressure, vibration, sonication, heat or combinations thereof. In another embodiment the selected fluid is captured within the microchannel. Another embodiment provides for curing the encapsulant by addition of a catalyst or by heat control. A further embodiment provides for nanomaterials and/or micromaterials that are added to the encapsulating media, encapsulant or both prior to forming the microcapsules.

Another embodiment includes a method for making a corrosion prevention coating material by providing a precursor coating material; and mixing a liquid or solid micronetwork comprising corrosion inhibitor with the precursor coating material. Typically, the liquid or solid micronetwork contains a nanomaterial, micromaterial or a combination thereof.

Another embodiment provides for a method for protecting a surface from corrosion by coating the surface with a coating material having a liquid or solid micronetwork that includes a corrosion inhibitor. Typically, the liquid or solid micronetwork contains a nanomaterial and/or a micromaterial.

Another embodiment of the invention provides for a microchannel comprising one or more microchannels/cylinders separated from the microcapsules of the micronetwork. Typically in some embodiments a nanomaterial, micromaterial or a combination thereof is incorporated in the microchannel. The nanomaterial, micromaterial, or a combination thereof may be a crack or corrosion controller or inhibitor. In yet other embodiments, a crack or corrosion inhibitor is enclosed within the microchannel. In some embodiments the nanomaterial or micromaterial is incorporated in a wall or shell of the microchannel.

One aspect of the invention provides for a two resin system made up of dicyclopentadiene where one was in the liquid phase and the other in the solid phase at room temperature. The liquid system could be processed at room temperature while the solid phase system requires additional thermal energy to produce micronetworks. Resin systems having properties similar to dicyclopentadiene may be used.

The microencapsulation of single walled carbon nanotubes was shown with both liquid and solid phase systems. The single walled carbon nanotubes addition appeared to reinforce the microcapsule shell by increasing fracture toughness. Dispersing the nanoparticles within the encapsulating media could further increase this.

Figure 1B:
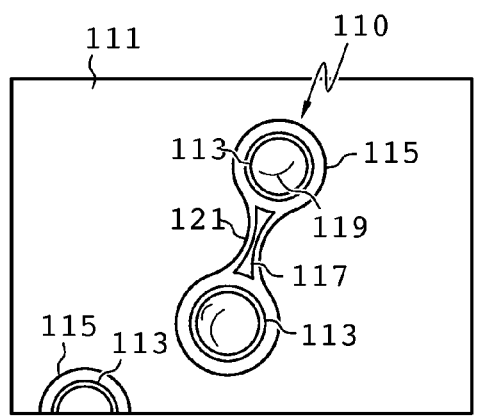
Figure 1C:
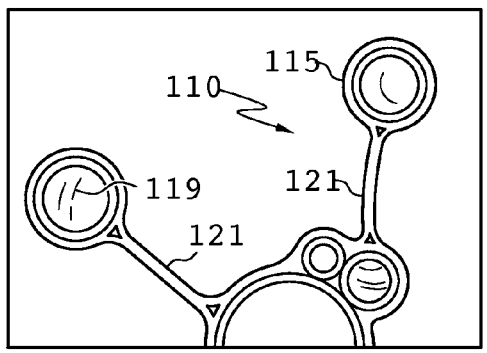
Figure 1D:
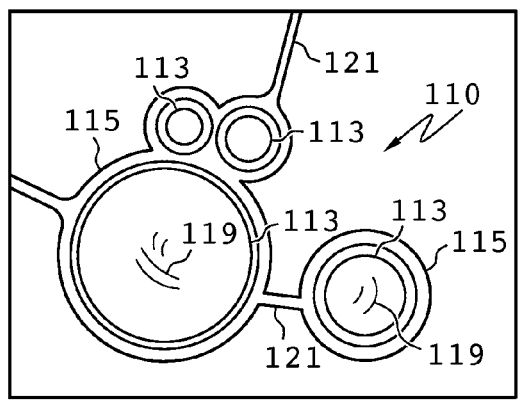

Referring now to FIG. 1A, the figure shows the nanocapsules 101. The dark portions 103 are artifacts in the image. FIG. 1B illustrates a drawing of an image of two microcapsules that were suspended in water 111 and formed a micronetwork 110. The micronetwork 110 consists of the original microcapsules 113 surrounded by resin 115 that has escaped from the capsules at fractures 119. A microchannel 121 encloses fluid that is typically from the surrounding fluid (water 111). FIG. 1C is a drawing that shows a further micronetwork 110. FIG. 1D is a drawing that depicts FIG. 1C at slightly larger magnification.

Figure 2:
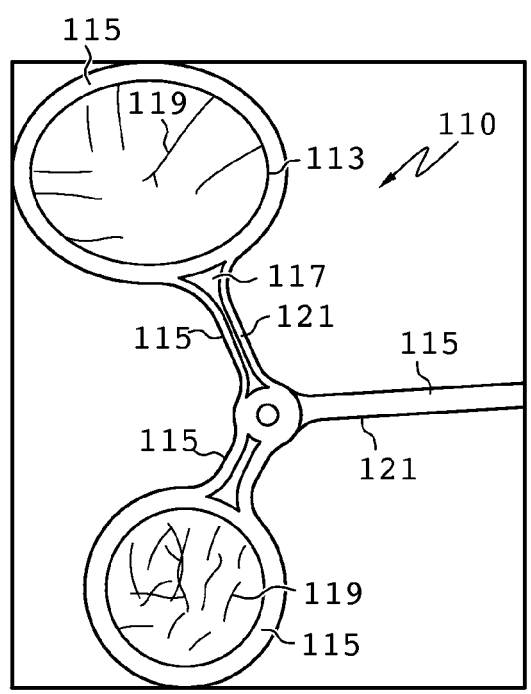
FIG. 2 is a drawing of an image of two microcapsules that have been fractured to form a micronetwork between microcapsules without particle additives. These capsules are interconnected by microchannels/cylinders.
Figure 3:
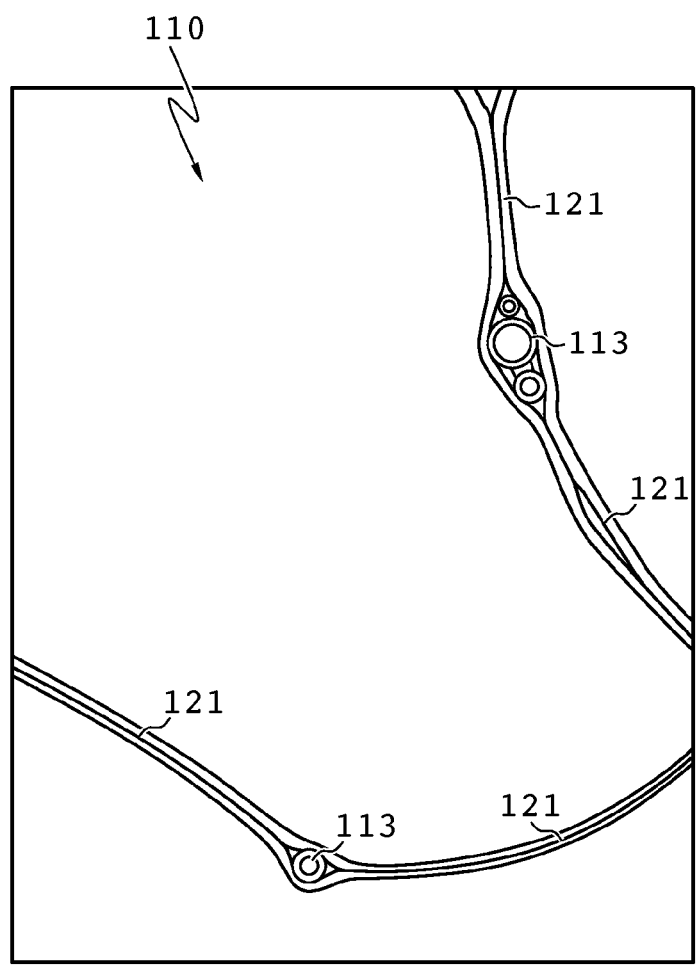
FIG. 3 is an image showing an elongated network between several microcapsules without particle additives.
Figure 4:
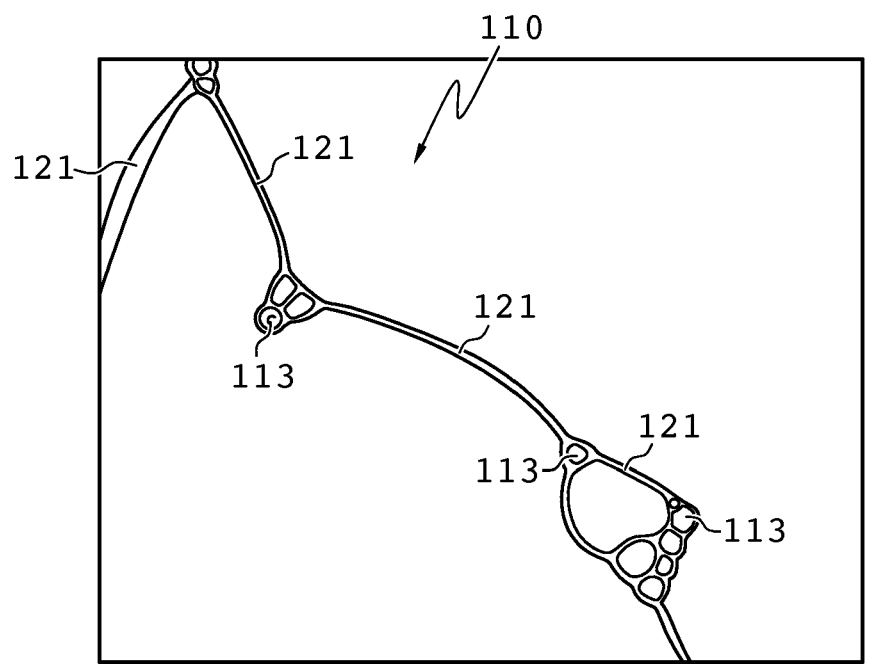
FIG. 4 is an image showing an elongated nanocomposite micronetwork between several microcapsules interconnected by microchannels/cylinders containing single walled carbon nanotubes.
Figure 5:
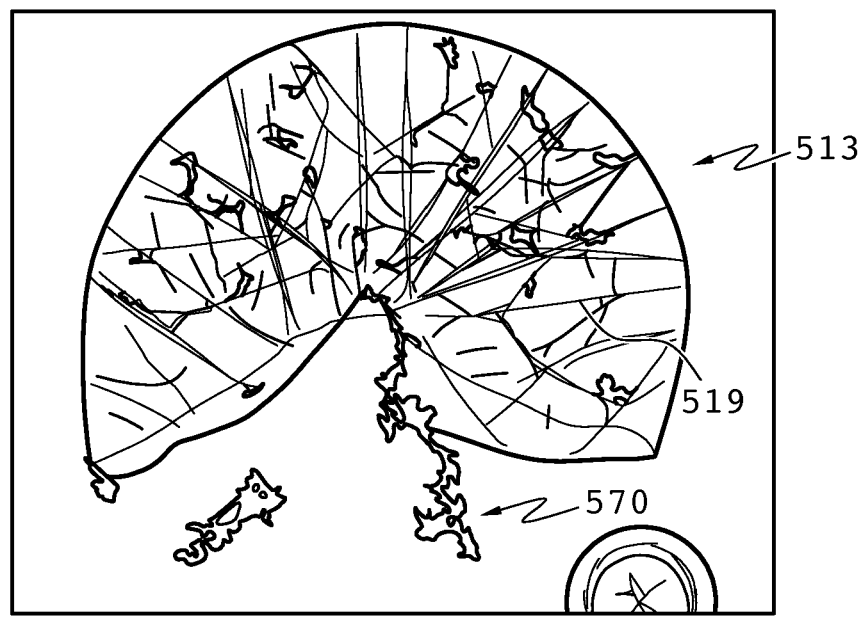
FIG. 5 is an image of a single walled carbon nanotubes tendril radiating outward from the center of a fractured single walled carbon nanotubes-filled microcapsule. It should be noted that the microcapsule shell also contains single walled carbon nanotubes in this image.

Referring now to FIG. 2, the figure shows a micronetwork 110 having two fractured microcapsules 113 surrounded by resin 115. FIGS. 3 and 4 show images of extended microchannels/cylinders. FIG. 5 shows a microcapsule 513 that has been fractured by fractures 519. Micromaterials 570 have been added.

As shown in FIG. 5, single walled carbon nanotubes microchannel/cylinder reinforcements were produced up to 300 μm long within a liquid dicyclopentadiene matrix. The tendrils were observed to radiate outwards from the center of a fractured nanocomposite microcapsule. This microcapsule was dispersed too far from other microcapsules to form a micronetwork.

Figure 6:
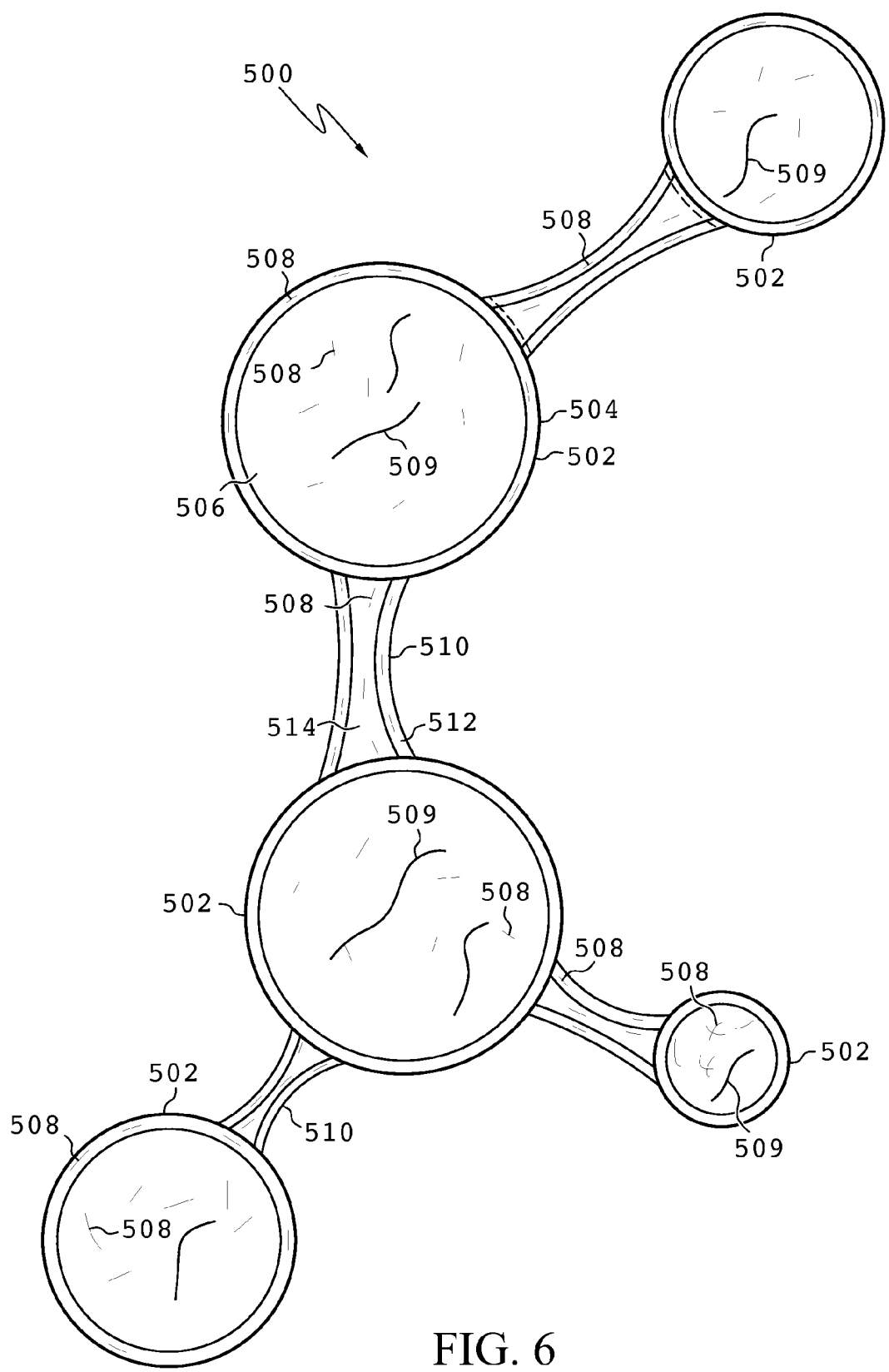
FIG. 6 is a schematic drawing of the details of a typical micronetwork interconnected by microchannels/cylinders.

Referring now to FIG. 6, this figure shows the details of a typical micronetwork 500 according to the invention. The basic building blocks of the micronetwork 500 are microcapsules 502. The microcapsules typically have a shell 504 that encloses a resin 506 in the liquid phase (or a solid that can become fluid). A typical resin is dicyclopentadiene. In some embodiments, fillers 508 such as nanotubes, buckyballs, nanoparticles, microparticles and the like may be incorporated into the microcapsules, micronetwork and/or the microchannels/cylinders to create a nanocomposite. Fractures 509 provide for fluid leakage and flow for forming the microchannels/cylinders. Under appropriate processing conditions described in more detail elsewhere herein microchannels/cylinders 510 are formed between microcapsules 502. In some cases the microchannels/cylinders 510 may not reach another microcapsule and thus be truncated. The microchannels/cylinders 510 typically consist of a wall 512 that encloses a central channel 514, which allows a fluid to flow. The central channel may contain fluid that was enclosed within the microchannel 510 during its formation, or it may be either hollow (tube) or completely solid (rod). If it is a solid rod, it is referred to as a microcylinder. Fillers 508 may be located in the microcapsule walls, microcapsule contents, central channel 514 and/or in the walls of the microchannel 510.

Figure 7:
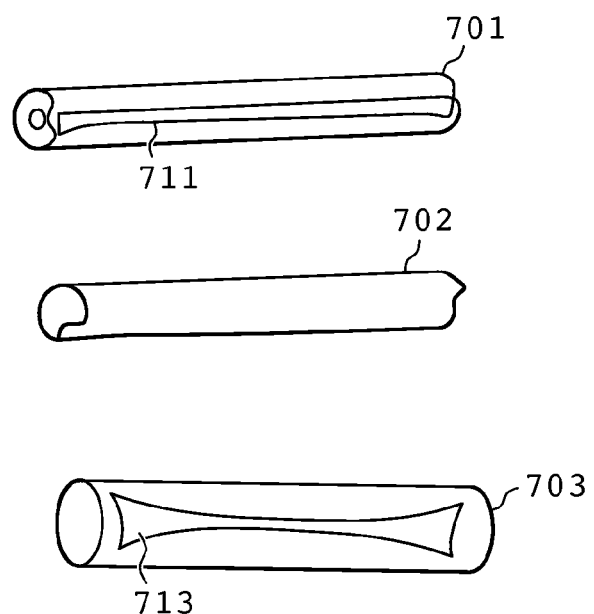
FIG. 7 is a schematic drawing illustrating details of a typical microchannel/cylinder.

Referring now to FIG. 7, microchannel 701, microcylinder 702, and microchannel 703 separated from their microcapsule are depicted. Microchannel 701 has an open microchannel 711 and microchannel 703 has a closed microchannel 713. Either microchannel 711, or 713 may contain additional encapsulant.

Once a micronetwork is formed it may be incorporated into a product or carrier material for final application. For example, in crack prevention it may be incorporated into a polymer or other material that is subsequently processed so that the fluid material in the micronetwork remains in a fluid state. Likewise in corrosion prevention it may be incorporated in a coating material that is subsequently applied to a surface to be protected. Upon crack formation or corrosion that reaches the micronetwork or microchannel/cylinder the micronetwork or microchannel/cylinder will be fractured and liquid material from the micronetwork or microchannel can flow into the crack or corrosion affected area to stop the crack or corrosion from spreading further.

In one embodiment for solid micronetworks, they may be used where the solid micronetwork is subsequently liquefied by elevated temperature during its protective phase.

Fillers such as single walled carbon nanotubes, multi-walled carbon nanotubes, buckyballs, or other nano/micro materials/particles are also useful in the present invention to enhance properties of the microcapsules, micronetworks or microchannels/cylinders.

Catalysts useful with the dicyclopentadiene include Grubbs' catalyst such as Aldrich No. 579726, Grubbs catalyst $1^{st}$ generation, or Aldrich No. 569747, Grubbs catalyst $2^{nd}$ generation, available from Sigma-Aldrich, Milwaukee, Wis. 53201, USA). In some embodiments thermal energy can be applied above room temperature (about 30-80° C.) with sufficient time.

Microcapsule/cylinder diameters of about 1-1000 um diameters are useful with the invention. More preferred are diameters of about 5-500 um, and most preferred are diameters of about 50-200 um. Typically the microchannels/cylinders have a diameter of about 0.1 um to about 1000 um.

Some embodiments disclosed include using nanomaterials. As used herein nanomaterials include nanotubes, buckyballs, nanofibers, nanowhiskers, nanospheres and combinations thereof. Micromaterials as used herein include microtubes, microfibers, microwhiskers, microspheres, microcapsules, and combinations thereof.

The following examples are illustrative of the invention and are not meant to limit the scope of the invention in any way.

Example 1

This example illustrates the preparation of microcapsules and the formation of micronetworks and/or microchannels/cylinders without the addition of nanoparticles with dicyclopentadiene, $C_{10}H_{12}$ (CAS No 77-73-6), in the liquid phase (Acros Organics, Belgium, Product No 15076-0000) at room temperature (about 23° C.).

The preparation of microcapsules by in situ polymerization using the preparative method from: White, S. R. et al.; Autonomic Healing of Polymer Composites; Nature 409 Feb. 15, 2001, pages 794-797.

This method is a complex coacervation, which demands the following
1. The core material must be immiscible (driven by thermodynamics) in the aqueous phase.
2. Emulsification is by mechanical agitation where the size and distribution of the capsules is determined by fluid mechanics (i.e. shear rate). A paddle stirrer with at least a 400 rpm stir rate is preferred.
3. Ph adjustments are necessary to cause phase separation of the polymers. One phase is the coacervate (high concentration of the two polymers), and the other phase is the supernatant (low concentration of the two polymers). The coacervate adsorbs on droplet-forming microcapsules, and it is hardened first by cooling, then it is crosslinked by the addition of a crosslinking agent, such as formaldehyde.
4. Fracture is driven by mechanics and materials science.

The following steps were used:
1. Urea (7.0 g) was dissolved in a 600 ml beaker containing deionized water (150 ml) followed by resorcinol (0.5 g) and ammonium chloride (0.5 g).
2. A 5 wt. % solution of ethylene maleic anhydride copolymer (100 ml) was added to the reaction mixture of step 1.
3. The pH of the reaction mixture of step 2 was adjusted to about 3.5 using a 10% NaOH solution.
4. The reaction mixture of step 3 was agitated at 454 rpm with a paddle stirrer and 60 ml of dicyclopentadiene in the liquid phase was added drop wise to the stirring solution to achieve an average droplet size of 200 μm in an emulsion.

5. To the agitated emulsion of step 4 was added 37% formaldehyde (0.23 ml, 18.91 g) solution.
6. The temperature of the reaction mixture of step 5 was raised to 50° C. and maintained for two hours while continuing stirring.
7. 200 ml of deionized water was added to the reaction mixture of step 6 with continued stirring.
8. After an additional four hours at 50° C., the reaction mixture was cooled to room temperature. The stirring was stopped and the microcapsules were separated as a microcapsule slurry.
9. The microcapsule slurry was diluted with an additional 200 ml of deionized water and washed three times with 500 ml of deionized water.
10. The microcapsules were isolated by vacuum filtration and air-dried.

Microcapsule diameters that were produced ranged from about 5 to about 300 μm, depending on shear rate, which could be controlled by a combination of vessel size and agitation speed. The higher the shear rate, the smaller the microcapsules. As noted above, a 454 rpm stirring rate produced microcapsules having an average diameter of 200 μm.

The microcapsules were then screened out so that microcapsules with diameters of less than 200 μm passed through. Approximately 10 to 50 microcapsules (<1 ml of aqueous solution) were then placed onto a glass slide for processing via automatic pipette. A glass cover slip was placed over the microcapsules. Mechanical force was applied to the cover slip in a tapping mode to induce fracture of the microcapsules. The fractured microcapsules were placed on a hot plate overnight at a temperature of about 50° C. to about 60° C. which resulted in the self-assembly of a network such as that illustrated in the Figures. Polymerization of the cyclopentadiene dimer to form the resulting micronetworks was accomplished with Grubbs catalyst $1^{st}$ generation.

Example 2

This example illustrates the preparation of microcapsules without the addition of nanoparticles with dicyclopentadiene in the solid phase (Aldrich, USA, Product No. 454338) at room temperature In this example, all steps were followed as in Example 1 except that during step 4 the solid phase of dicyclopentadiene was heated to a temperature between 25° C. and 50° C. to facilitate melt/flow.

Example 3

This example illustrates the preparation of a microcapsule nanocomposite system with single-walled carbon nanotubes.

In this example, the steps of Example 1 were followed except that during step 4 the liquid phase of dicyclopentadiene was mixed with <1 vol. % of single walled carbon nanotubes to introduce single walled carbon nanotubes during the preparation of the microcapsules by in situ polymerization. This was accomplished by mixing <1 vol. % of the single walled carbon nanotubes with 20 ml of dicyclopentadiene. This system was then mixed by stirring at 454 rpm for 1-2 minutes. Then, 10 ml of additional dicyclopentadiene was added and stirred for an additional 1-2 minutes. As a result, the single walled carbon nanotubes were not only present in the core material, but they were also present in the capsule material, providing functional features, such as increased fracture toughness, modulus and healing efficiency.

In other examples, nanotubes or buckyballs could be also added to the capsule solution to further enhance the functional features of the capsule due to the incorporation of the nanotubes or buckyballs.

Example 4

The military and intelligence community have a need for advanced camouflage systems that have chameleon-type characteristics where they can change their color/pattern to match the surrounding environment. It is envisioned that the nanocomposite micronetworks have the potential to provide the underlying self assembling architecture for smart camouflage systems that may be able to rapidly change a surface from one color/pattern to another. The basis of this self-assembly would be a parallel-type of process where large numbers of nanotube-filled microcapsules would be processed in an applied coating simultaneously to form a nanocomposite micronetwork. These micronetworks would contain single and/or multi-walled nanotubes so that they would have excellent thermal, electrical and mechanical properties. Furthermore, the micronetworks would contain the morphing polymer themselves to create an all inclusive smart camouflage system. Therefore, this network could deliver an effective thermal or electrical stress to a coating in order to create a color/pattern change.

Some potential core and shell smart materials that can be added to the and/or nanomaterials to give a resulting coating unique optical, magnetic and electrical properties would include electroluminescent and electroluminescent materials, which are described in an article by Hardaker, Stephen et al; Progress toward Dynamic Color-Responsive "Chameleon" Fiber Systems; MRS Bulletin, August, 2003, p. 564-567. These dynamic materials would have unique and tunable properties across the visible, IR and UV spectrum.

While the forms of the invention herein disclosed constitute presently preferred embodiments, many others are possible. It is not intended herein to mention all of the possible equivalent forms or ramifications of the invention. It is to be understood that the terms used herein are merely descriptive, rather than limiting, and that various changes may be made without departing from the spirit of the scope of the invention.

We claim:

1. A micronetwork comprising
a plurality of microcapsules connected to each other through microchannels, wherein the microchannels are cylindrical in shape; and
wherein each cylindrical shaped microchannel comprises a wall that encloses a channel containing a liquid, wherein the liquid within each cylindrical shaped microchannel is encapsulated from a surrounding liquid during formation of the cylindrical shaped microchannel, wherein the cylindrical shaped microchannel is produced by
a. fracturing one or more microcapsules suspended in the surrounding liquid; and
b. releasing a liquid encapsulant from within the microcapsules to the surrounding liquid to form the cylindrical shaped microchannels connecting to nearby microcapsules, wherein the liquid encapsulant within the microcapsule is unpolymerized or uncured dicyclopentadiene (DCPD); and wherein the liquid within the microchannel further comprises the unpolymerized or uncured liquid DCPD and crack or corrosion inhibitors.

2. The micronetwork according to claim 1, wherein a liquid encapsulant from within the microcapsules forms the wall of each cylindrical shaped microchannel.

3. The micronetwork according to claim 1, wherein the cylindrical shaped microchannels are about 1 μm to about 500 μm long.

4. The micronetwork according to claim 1, wherein the microcapsules have an average size ranging from about 1 to about 100 μm.

5. The micronetwork according to claim 1, wherein upon a crack or a corrosion that reaches the cylindrical shaped microchannel, the cylindrical shaped microchannel is fractured and the liquid within the cylindrical shaped microchannel flows into the crack or corrosion to stop the crack or corrosion from spreading further.

6. A micronetwork for encapsulating a liquid, comprising
   a plurality of microcapsules connected to each other through microchannels, wherein the microchannels are cylindrical in shape;

wherein each cylindrical shaped microchannel comprises a wall that encloses a channel containing a liquid;

wherein the liquid within each cylindrical shaped microchannel is encapsulated from a surrounding liquid in which the microcapsules are suspended;

wherein unpolymerized or uncured liquid dicyclopentadiene (DCPD) is encapsulated within the microcapsule; and wherein the liquid within the microchannel further comprises the unpolymerized or uncured liquid DCPD and crack or corrosion inhibitors.

* * * * *